United States Patent [19]
Malinowski et al.

[11] Patent Number: 5,887,607
[45] Date of Patent: Mar. 30, 1999

[54] WAFER PROCESSING APPARATUS

[75] Inventors: Darrin Malinowski; Dave Korn, both of Boise, Id.

[73] Assignee: Micron Technology, Inc., Boise, Id.

[21] Appl. No.: 888,994

[22] Filed: Jul. 7, 1997

[51] Int. Cl.⁶ .................................................. B08B 3/12
[52] U.S. Cl. .......................... 134/172; 134/184; 134/199; 134/902
[58] Field of Search ............................. 134/902, 1.2, 1.3, 134/172, 184, 186, 199; 156/345 L

[56] References Cited

U.S. PATENT DOCUMENTS

| | | | |
|---|---|---|---|
| 5,423,944 | 6/1995 | Wong | 156/646.1 |
| 5,427,622 | 6/1995 | Stanasolovich et al. | 134/1 |
| 5,520,205 | 5/1996 | Guldi et al. | 134/98.1 |
| 5,533,540 | 7/1996 | Stanasolovich et al. | 134/155 |
| 5,534,076 | 7/1996 | Bran | 134/1 |
| 5,579,792 | 12/1996 | Stanasolovich et al. | 134/184 |
| 5,672,212 | 9/1997 | Manos | 134/1.3 |
| 5,698,038 | 12/1997 | Guldi et al. | 134/1 |
| 5,698,040 | 12/1997 | Guldi et al. | 134/1.3 |

OTHER PUBLICATIONS

"Megasonics" http://clean.rti.org/me–gen.htm, Mar. 20, 1997.
"Silicon Processing For the VLSI Era" by Stanley Wolf Ph.D., (Lattice Press) pp. 514–520.
"Microchip Fabrication" by Peter Van Zant, (McGraw–Hill) pp. 172–182.

Primary Examiner—Philip R. Coe
Attorney, Agent, or Firm—Killworth, Gottman, Hagan & Schaeff, L.L.P.

[57] ABSTRACT

A wafer processing apparatus is provided and includes a wafer carrier positioned in a processing vessel and arranged to support a plurality of wafers within the processing vessel such that the wafers define respective wafer gaps between adjacent wafers. A drive assembly is arranged to position respective processing plates in the respective wafer gaps such that respective major plate surfaces oppose respective major wafer surfaces. The processing plates are arranged to initiate a wafer processing operation.

22 Claims, 5 Drawing Sheets

WAFER PROCESSING APPARATUS

BACKGROUND OF THE INVENTION

The present invention relates to semiconductor wafer processing and, particularly, to an apparatus for cleaning or otherwise processing a plurality of wafers positioned adjacent each other in a wafer carrier.

Semiconductor devices are typically fabricated on a circular semiconductor substrate called a wafer. Particulate matter present on the wafer surface during fabrication of the semiconductor device is problematic because particles present in active die areas of the wafer cause circuit defects. These defects result in nonfunctional electronic devices and increase the cost of semiconductor device production.

Conventional wafer surface cleaning systems use a cleaning solution in a tank coupled with a megasonic transducer to remove particulate matter from wafer surfaces. The wafers are typically vertically oriented in the tank and some parts of the wafer (and some wafers) are significantly farther way from the megasonic energy source than others. For example, the transducer may be positioned at the bottom of the tank. The result is a non-uniform cleaning rate from the bottom of the wafers to the top of the wafers. As wafers increase in size to accommodate larger circuits and increasing integration, the non-uniformity in cleaning rate increases in significance. Known systems attempt to correct this nonuniform effect by increasing processing time. Unfortunately, the increased processing time increases production costs. Similarly, other wafer processing systems, wherein wafers to be processed are held side-by-side in a wafer carrier or boat, also suffer from processing non-uniformity and decreased production efficiency.

Accordingly, there is a need for a wafer processing system wherein processing uniformity and processing time is improved without sacrificing process quality.

BRIEF SUMMARY OF THE INVENTION

This need is met by the present invention wherein a wafer processing apparatus comprising a processing plate assembly defining an interdigitated array of mounted wafer positions and processing plate positions is provided.

In accordance with one embodiment of the present invention, a wafer processing apparatus is provided comprising a processing vessel, a wafer carrier, and a processing plate assembly. The wafer carrier is positioned in the processing vessel and is arranged to support a plurality of wafers such that the wafers define respective wafer gaps between adjacent ones of the plurality of wafers. The processing plate assembly includes a plurality of processing plates and is arranged to permit positioning of respective processing plates in the respective wafer gaps. The processing plate assembly is preferably further arranged to initiate a wafer processing operation. Preferably, the wafers lie in substantially parallel planes. The processing vessel defines a vessel interior and the wafer gaps are preferably limited to the vessel interior.

The wafer processing apparatus may further comprise a sonic transducer assembly coupled to the processing plate assembly. The sonic transducer assembly may define arrays of sonic point sources at the processing plates. Each of the processing plates includes respective first and second major plate surfaces, and one of the plurality of sonic transducer arrays is preferably positioned on at least one of the respective first and second major plate surfaces. Alternatively, one of the plurality of sonic transducer arrays is positioned on both of the respective first and second major plate surfaces. According to yet another alternative, one of the plurality of sonic transducer arrays is provided on at least one opposing major plate surface within at least one pair of opposing major plate surfaces. Further, one of the plurality of sonic transducer arrays may be provided on both of the opposing major plate surfaces within the pairs of opposing major plate surfaces.

The wafer processing apparatus may further comprise an electrical charging unit coupled to the processing plate assembly. The charging unit may be arranged to induce a charge on the plurality of processing plates.

The wafer processing apparatus may further comprise a material emission assembly coupled to the processing plate assembly. The emission assembly may define at least one emissive point source at the processing plates. A plurality of emissive port arrays may be provided on at least one or both of the respective first and second major plate surfaces. Alternatively, where the plurality of processing plates define a plurality of pairs of opposing major plate surfaces, one of the plurality of emissive port arrays is provided on one or both of the opposing major plates surface within at least one pair of opposing major plate surfaces.

The wafer processing apparatus may further comprise a rotary drive assembly coupled to the processing plate assembly. The drive assembly may be arranged to move the plurality of processing plates. The rotary drive assembly and the processing plate assembly may collectively define a processing plate rotary path extending across an open upper vessel boundary to an external vessel location.

The wafer processing apparatus may further comprise at least one emissive point source at each of the plurality of processing plates, a rotary drive assembly coupled to the processing plate assembly, and a material emission duct in communication with each of the emissive point sources. The material emission duct may be defined within or coupled to the processing plate assembly.

In accordance with another embodiment of the present invention, a wafer processing apparatus is provided comprising a processing vessel, a wafer carrier, and a processing plate assembly. The wafer carrier defines a plurality of adjacent mounted wafer positions. The mounted wafer positions are within the processing vessel. The processing plate assembly includes a plurality of processing plates defining a plurality of adjacent processing plate positions. The mounted wafer positions and the processing plate positions define an interdigitated array of mounted wafer positions and processing plate positions. Preferably, the mounted wafer positions and the processing plate positions are substantially parallel to one another.

In accordance with yet another embodiment of the present invention, a semiconductor wafer cleaning apparatus is provided comprising an aqueous solution contained within a processing vessel, a wafer carrier, a processing plate assembly, a plurality of sonic transducer arrays, and a rotary drive assembly. The wafer carrier defines a plurality of adjacent mounted wafer positions bounded by the aqueous solution within the processing vessel. The processing plate assembly includes a plurality of processing plates defining a plurality of adjacent processing plate positions. The mounted wafer positions and the processing plate positions define an interdigitated array of mounted wafer positions and processing plate positions. Each of the plurality of processing plates includes respective first and second major plate surfaces. The plurality of processing plates define a plurality of pairs of opposing major plate surfaces and one of the plurality of sonic transducer arrays is provided on at least one opposing major plate surface within at least one of the pairs of opposing major plate surfaces. A rotary drive assembly is coupled to the processing plate assembly. The rotary drive assembly and the processing plate assembly collectively define a processing plate rotary path extending from the plurality of processing plate positions across an open upper vessel boundary to an external vessel location.

In accordance with yet another embodiment of the present invention, a wafer processing apparatus is provided comprising a plurality of emissive port arrays. One of the plurality of emissive port arrays is positioned on at least one of the respective first and second major plate surfaces. A material emission duct is provided in communication with each of the emissive point sources and the material emission duct is defined within the processing plate assembly.

In accordance with yet another embodiment of the present invention, a wafer processing apparatus is provided comprising a processing vessel, a wafer carrier, a processing plate assembly, and a drive assembly. The wafer carrier is positioned in the processing vessel and arranged to support a plurality of wafers within the processing vessel such that the wafers define respective wafer gaps between adjacent ones of the plurality of wafers. The wafer gaps are defined between opposing major wafer surfaces of respective adjacent wafers. The processing plate assembly includes a plurality of processing plates having respective major plate surfaces. The drive assembly is arranged to position respective processing plates in the respective wafer gaps such that respective major plate surfaces oppose respective major wafer surfaces.

Accordingly, it is an object of the present invention to provide a wafer processing apparatus whereby improved wafer processing uniformity is achieved by positioning respective wafer processing plates in respective wafer gaps.

DETAILED DESCRIPTION OF THE INVENTION

Figure 1:
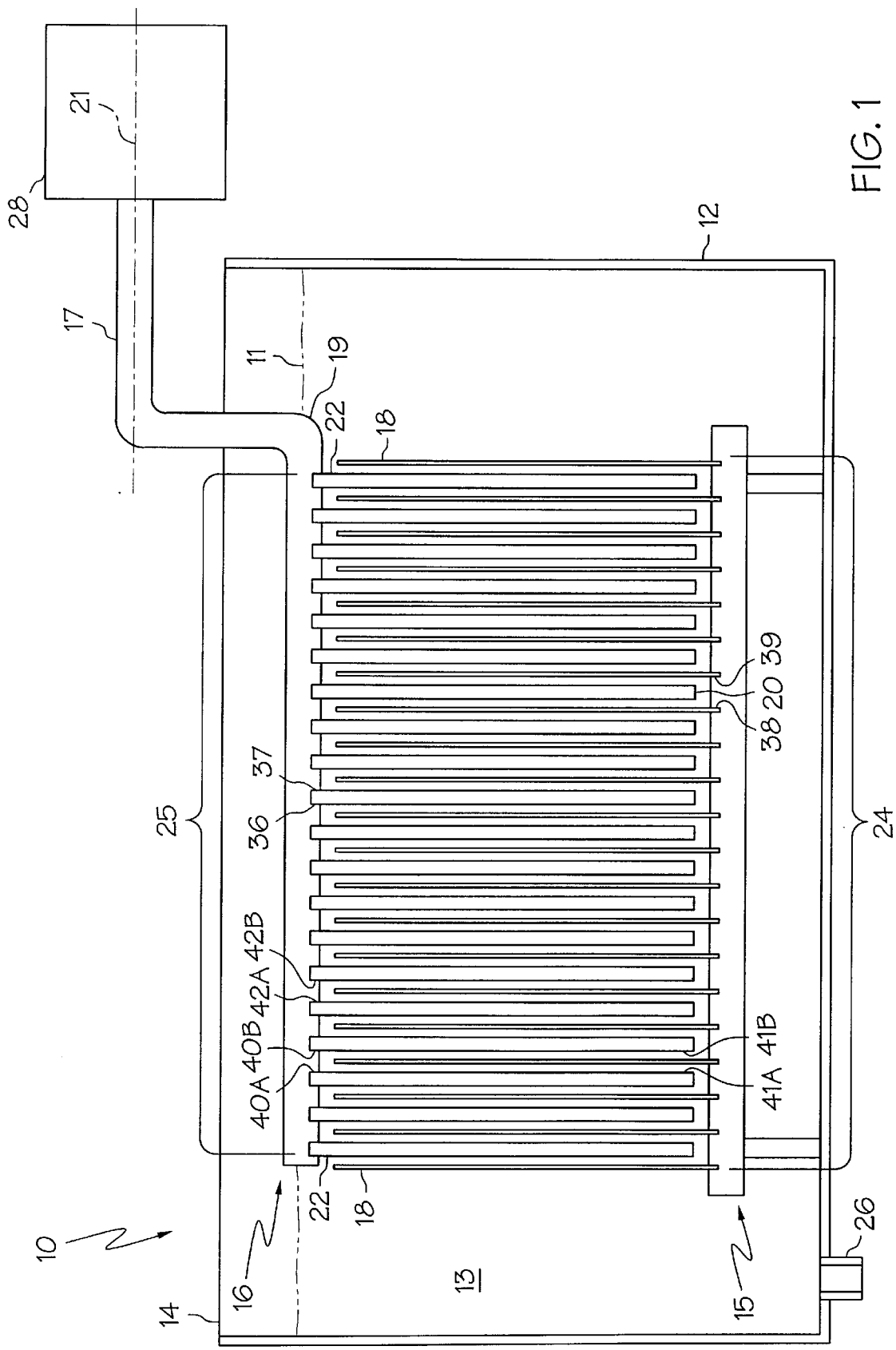
FIG. 1 is a schematic illustration of a wafer processing apparatus according to the present invention.

FIGS. 1–5, where like elements are indicated with like reference numerals, illustrate a wafer processing apparatus 10 comprising a processing vessel 12, a wafer carrier 15, and a processing plate assembly 16. The wafer carrier 15, which may be any one of a plurality of conventional wafer carriers suitable for use in the present invention, is positioned in the processing vessel 12 and is arranged to support a plurality of parallel, spaced wafers 18 such that the wafers 18 define respective wafer gaps 20 between opposing first and second major wafer surfaces 38, 39 of adjacent ones of the plurality of parallel wafers 18. The processing vessel 12 defines a vessel interior 13 and an open upper vessel boundary 14. The wafers 18 and the wafer gaps 20 are limited to the vessel interior 13, as is illustrated in FIG. 1. A liquid solution 11 is typically contained within the processing vessel 12 to facilitate or enhance wafer processing operations. The solution preferably completely surrounds the wafers 18 and may comprise deionized water, an acid bath, a fluid selected to induce or enhance a specific chemical reaction or mechanical operation with the wafers 18, or combinations thereof. A drain port 26 is provided for solution removal. The wafers 18 are generally any wafer-shaped objects and are typically semiconductor wafers used for integrated circuits and electronic devices.

Figure 2:
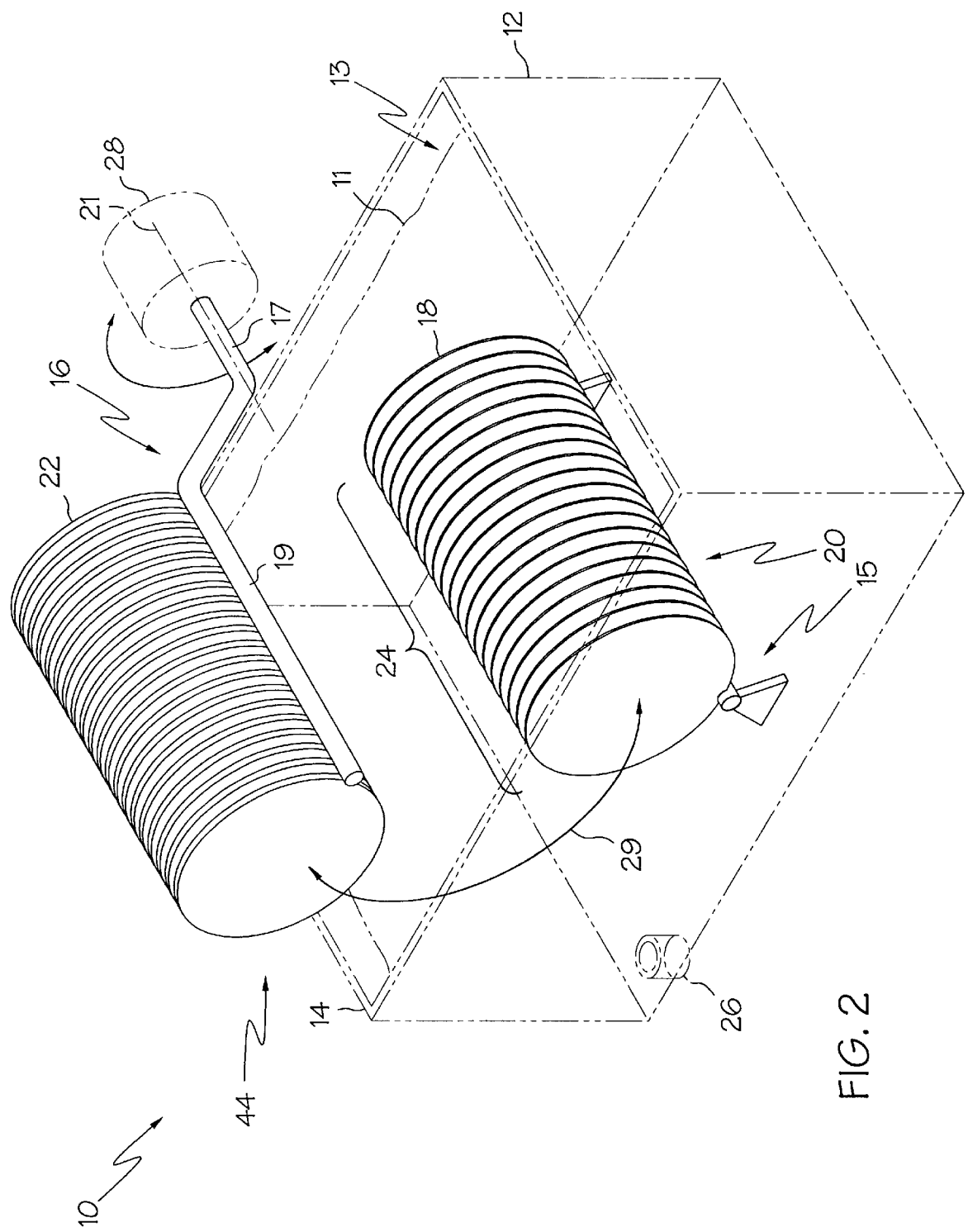
FIGS. 2 and 3 are isometric illustrations of a wafer processing apparatus according to the present invention illustrating the rotational movement of the processing plate assembly.
Figure 3:
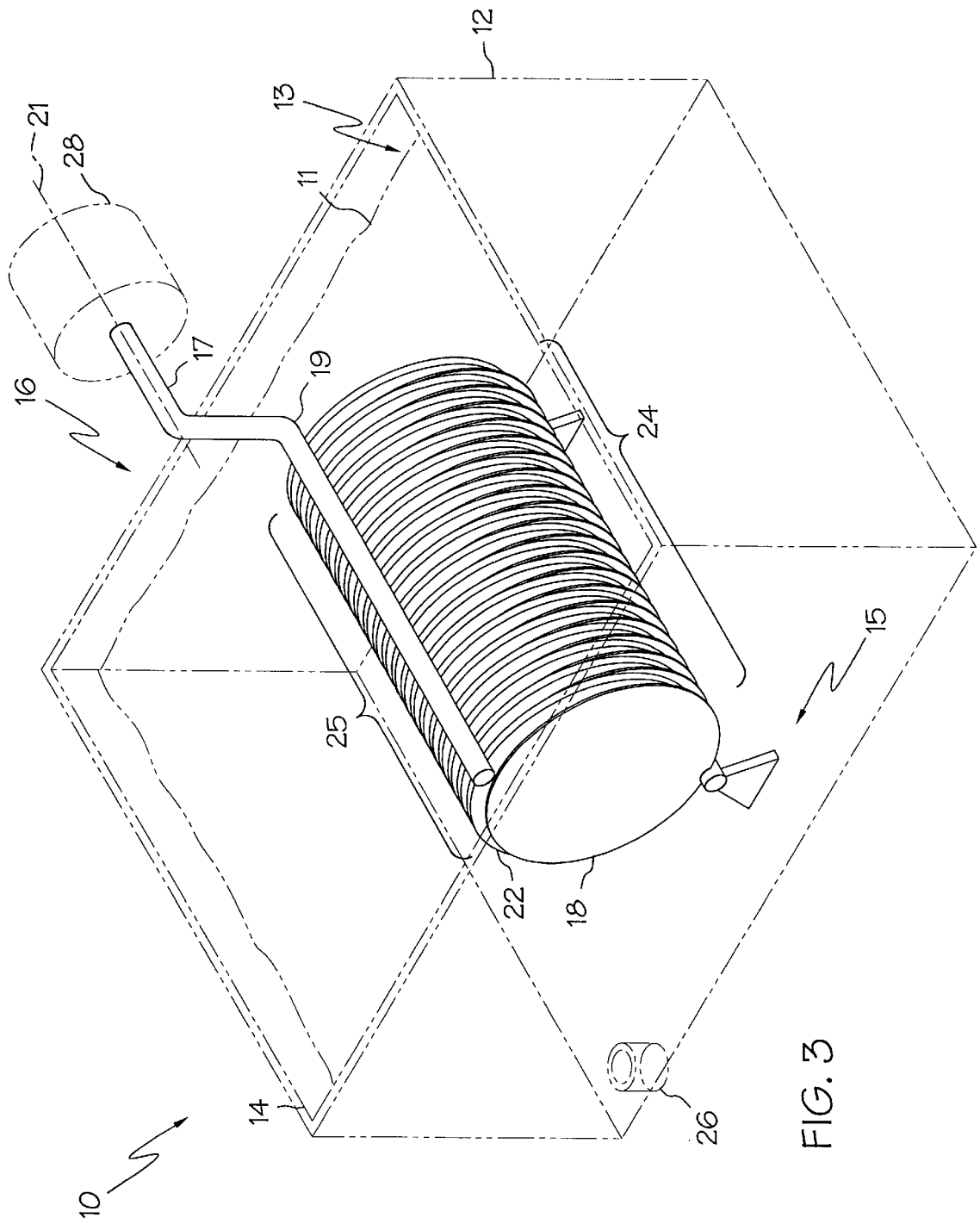

The processing plate assembly 16 is arranged to initiate a wafer processing operation, e.g., cleaning, treating, etching, semiconductor component manufacturing steps, etc. The plate assembly 16 includes a plurality of processing plates 22 and is arranged to permit positioning of respective processing plates 22 in the respective wafer gaps 20. Specifically, the wafers 18, positioned as is illustrated in FIGS. 2 and 3, occupy a plurality of adjacent mounted wafer positions 24 defined by the wafer carrier 15. Further, the processing plates 22, positioned as is illustrated in FIG. 3, occupy a plurality of adjacent processing plate positions 25. The mounted wafer positions 24 and the processing plate positions 25 are substantially parallel. In this manner, the mounted wafer positions 24 and the processing plate positions 25 define an interdigitated array of mounted wafer positions 24 and processing plate positions 25, as is illustrated in FIGS. 1 and 3. For the purposes of describing and defining the present invention, an interdigitated array comprises any structural sequence of components including a series of component sets wherein each component set includes at least one structural component of a first type, e.g., a wafer 18, positioned between at least two structural components of a second type, e.g., a plate 22. The components of one component set may also be considered members of at least one other component set. The interdigitated array of FIG. 1 is defined herein as a 1-1-1 (wafer/plate/wafer) interdigitated array because it includes a single component of a first type positioned between respective single components of a second type. It is contemplated by the present invention, that the interdigitated array may be a 1-1-2-1-2-1 (plate/wafer/plate/wafer/plate/wafer) array, a 1-2-1-2 (plate/wafer/plate/wafer) array, or any other type of interdigitated array, as long as each wafer 18 is positioned adjacent at least one processing plate 22.

A rotary drive assembly 28 is coupled to the processing plate assembly 16. The drive assembly 28 is arranged to move the plurality of processing plates 22 into and out of the processing plate positions 25. The drive assembly 28 and the processing plate assembly 16 collectively define a processing plate rotary path 29 extending from the plurality of processing plate positions 25 across the open upper vessel boundary 14 to an external vessel location 44, see FIG. 2. In this manner, respective processing plates 22 may be positioned in the respective wafer gaps 20 such that respective major plate surfaces 36, 37 oppose respective major wafer surfaces 38, 39. As is further clearly illustrated in FIG. 2, the processing plate assembly 16 includes a drive shaft base portion 17 and a drive shaft extension portion 19 extending from the drive shaft base portion 17. The drive shaft extension portion 19 is mechanically coupled to the plurality of processing plates 22. The rotary drive assembly 28 is mechanically coupled to the drive shaft base portion 17 and defines a drive shaft axis of rotation 21 substantially aligned with said drive shaft base portion 28. In this manner the drive shaft base portion 28 maintains a substantially stationary position as the plurality of processing plates 22 move into and out of the processing plate positions 25.

The effectiveness of the particular wafer processing operation initiated by the processing plate assembly 16 is enhanced as a result of the interdigitated relationship of the mounted wafers 18 and the processing plates 22. Specifically, chemical, mechanical, or electrical operations are produced directly adjacent the respective major wafer surfaces 38, 39. For example, a sonic transducer assembly 30, described in detail below with reference to FIG. 5A, operating in the megasonic frequency range (about 700 to about 1000 kHz) may be provided to effect cleaning of the wafer surfaces 38, 39. Alternatively, an emissive port array 56, described in detail below with reference to FIG. 5B, may be provided to create a reactive or non-reactive fluid flow across the wafer surfaces 38, 39. As a final example, a wafer processing operation may be initiated by inducing an electrical charge on the processing plates 22 in the manner described below with reference to FIG. 4.

Figure 4:
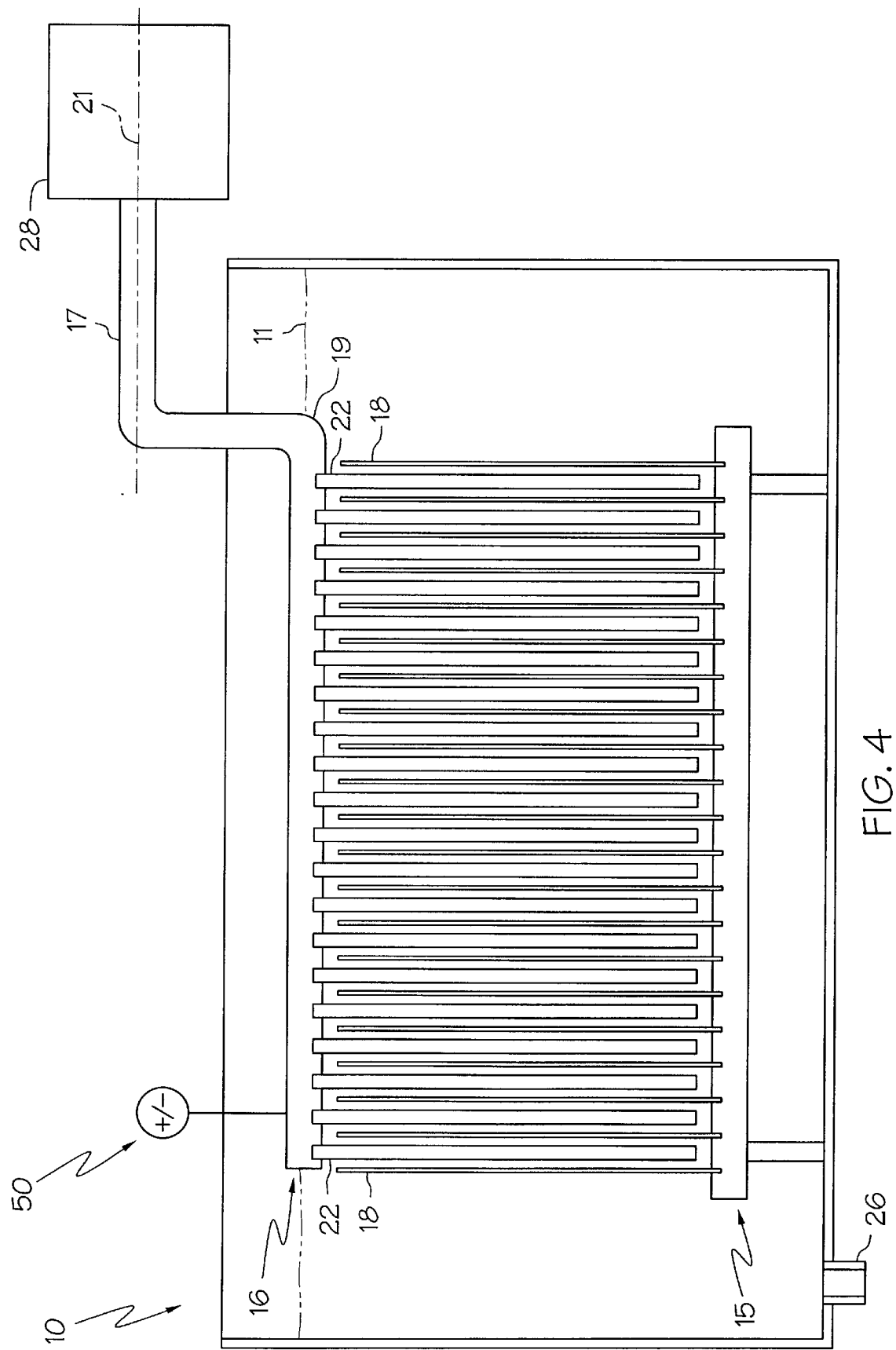
FIG. 4 is a schematic illustration of a wafer processing apparatus according to the present invention.

FIG. 4, illustrates an embodiment of the present invention wherein the wafer processing apparatus 10 includes an electrical charging unit 50 coupled to the processing plate assembly 16.

The charging unit 50 may be any one of a variety of conventional voltage sources arranged to induce a positive or negative charge on the plurality of processing plates 22. The magnitude and polarity of the charge will depend upon desired effects and optimum wafer processing. The charge may be utilized to move particles away from the wafer surface or to process the wafer in some other way, e.g., by inducing or enhancing a chemical reaction between the wafers 18 and the solution 11 contained within the processing vessel 12.

Figure 5B:
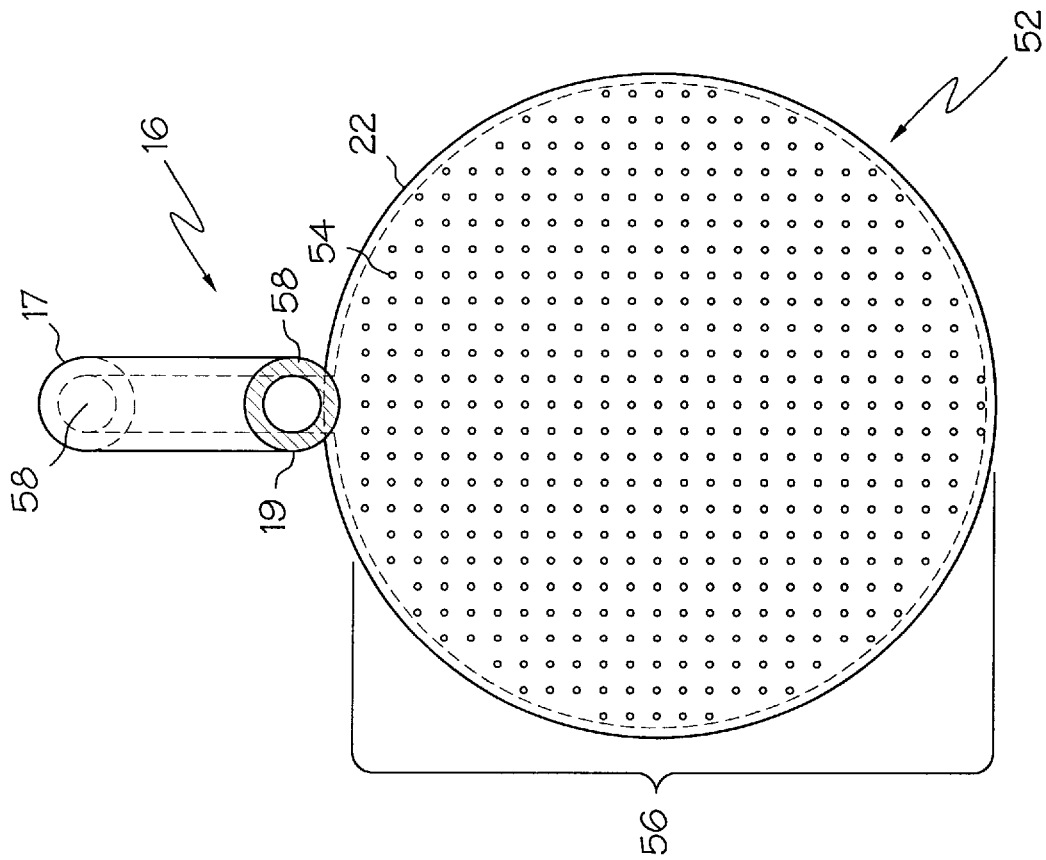
FIGS. 5A and 5B are schematic illustrations of processing plates according to the present invention.
Figure 5A:
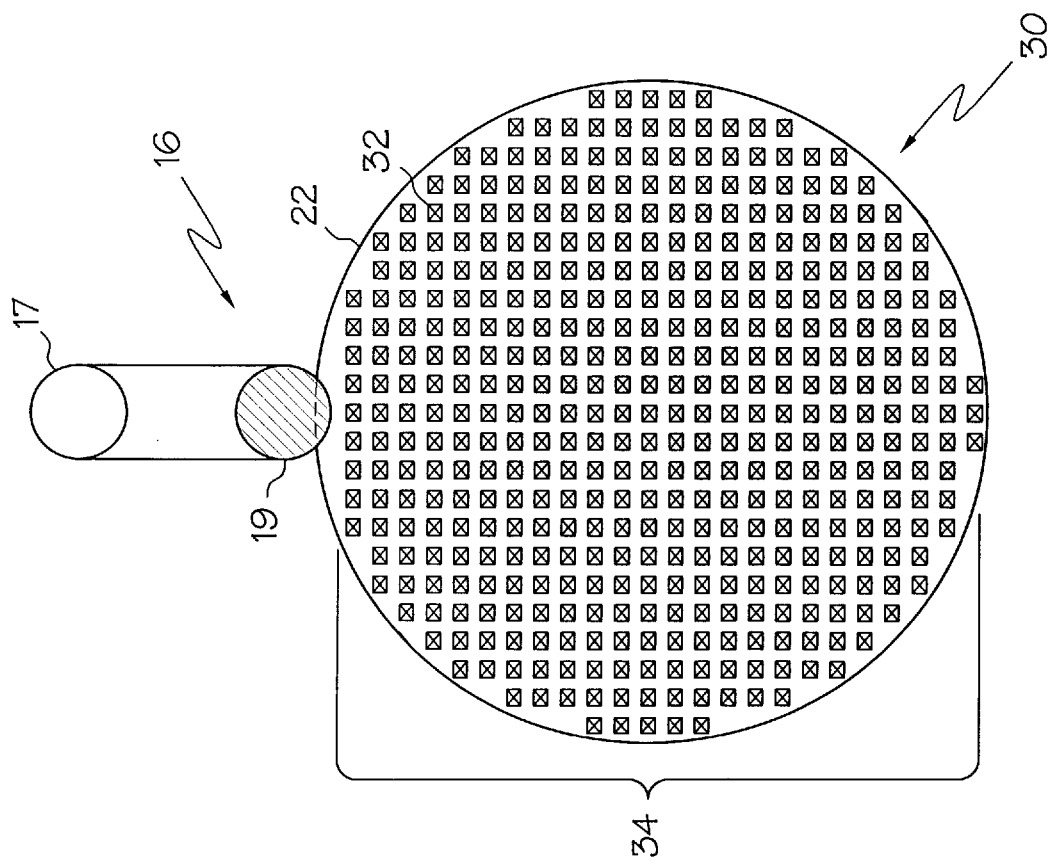

Referring now to FIGS. 1 and 5A, according to one aspect of the present invention, a sonic transducer assembly 30 is coupled to the processing plate assembly 16. The sonic transducer assembly 30 defines sonic point sources, i.e., sonic transducers 32, at the processing plates 22. Accordingly, a plurality of sonic transducer arrays 34 are provided where the wafer processing apparatus 10 includes a plurality of processing plates 22. Preferably, the sonic transducers 32 are controlled to operate in the megasonic frequency range (about 700 to about 1000 kHz). As will be appreciated by those skilled in the art, appropriate driving circuitry for the transducers 32 is provided within or coupled to the processing plate assembly 16.

The sonic transducer arrays 34 are positioned to ensure adequate and uniform wafer processing. For example, each of the plurality of processing plates 22 includes respective first and second major plate surfaces 36, 37 and one sonic transducer array 34 is positioned on one or both of the respective first and second major plate surfaces 36, 37. According to another aspect of the present invention, where the plurality of processing plates 22 define a plurality of pairs of opposing major plate surfaces, one of the sonic transducer arrays 34 is provided on at least one opposing major plate surface 40A, 40B, 41A, 41B, 42A, 42B, etc., within at least one of the pairs of opposing major plate surfaces. In this manner, at least one sonic transducer array 34 is provided within each wafer gap 20. It is contemplated by the present invention that sonic transducer arrays 34 may be provided on both of the opposing major plate surfaces 40A, 40B, 41A, 41B, 42A, 42B, etc., within at least one of the pairs of opposing major plate surfaces.

Referring now to FIGS. 1 and 5B, according to another aspect of the present invention, a material emission assembly 52 is coupled to the processing plate assembly 16. The material emission assembly 52 defines emissive point sources, e.g., apertures 54, at the processing plate 22. Accordingly, a plurality of emissive port arrays 56 are provided where the wafer processing apparatus 10 includes a plurality of processing plates 22.

A wafer processing fluid is emitted from the apertures 54 at the processing plates 22. The fluid is typically deionized water, ozonated deionized water, or another fluid selected to induce or enhance a specific chemical reaction or physical operation with the wafers 18. For example, where the wafers 18 are to be subject to a cleaning operation, deionized water is emitted from the apertures 54 and simultaneously drained from the drain port 26 to create a cleaning fluid flow across the surfaces of the wafers 18. The drain port 26 is typically metered such that the level of the aqueous solution 11 contained within the processing vessel 12 is maintained above the wafers 18, as is illustrated in FIG. 1.

The emissive port arrays 56 are positioned to ensure adequate wafer processing. For example, one emissive port array 56 is positioned on one or both of the respective first and second major plate surfaces 36, 37. According to another aspect of the present invention, where the plurality of processing plates 22 define a plurality of pairs of opposing major plate surfaces, one of the emissive port arrays 56 is provided on at least one opposing major plate surface 40A, 40B, 41A, 41B, 42A, 42B, etc., within at least one of the pairs of opposing major plate surfaces. In this manner, at least one emissive port array 56 is provided within each wafer gap 20. It is contemplated by the present invention that emissive port arrays 56 may be provided on both of the opposing major plate surfaces 40A, 40B, 41A, 41B, 42A, 42B, etc., within at least one of the pairs of opposing major plate surfaces.

A material emission duct 58 is provided in communication with each of the apertures 54. The material emission duct 58 is defined within the processing plate assembly 16 and within each processing plate 22. Alternatively, the material emission duct 58 may be coupled to, e.g., positioned on an outer surface of, the processing plate assembly 16 and each processing plate 22.

Having described the invention in detail and by reference to preferred embodiments thereof, it will be apparent that modifications and variations are possible without departing from the scope of the invention defined in the appended claims. For example, it is contemplated by the present invention that microprocessor controlled operations hardware may be provided to enable programmable control of the wafer processing apparatus 10 described herein.

What is claimed is:

1. A wafer processing apparatus comprising:
   a processing vessel;
   a wafer carrier positioned in said processing vessel, said wafer carrier being arranged to support a plurality of wafers such that said wafers define respective wafer gaps between adjacent ones of said plurality of wafers;
   a processing plate assembly including
      a plurality of processing plates,
      a drive shaft base portion,
      a drive shaft extension portion extending from said drive shaft base portion and mechanically coupled to said plurality of processing plates,
   wherein said processing plate assembly is arranged to permit positioning of respective processing plates in said respective wafer gaps; and
   a rotary drive assembly mechanically coupled to said drive shaft base portion, wherein
      said rotary drive assembly defines a drive shaft axis of rotation substantially aligned with said drive shaft base portion, and wherein said rotary drive assembly and said processing plate assembly collectively define a processing plate rotary path extending across an open upper vessel boundary to an external vessel location.

2. A wafer processing apparatus as set forth in claim 1 wherein said wafers lie in substantially parallel planes.

3. A wafer processing apparatus as set forth in claim 1 wherein said processing vessel defines a vessel interior and wherein said wafer gaps are limited to said vessel interior.

4. A wafer processing apparatus as set forth in claim 1 further comprising a sonic transducer assembly coupled to said processing plate assembly, said sonic transducer assembly defining at least one sonic point source at at least one of said plurality of processing plates.

5. A wafer processing apparatus as set forth in claim 1 further comprising a plurality of sonic transducer arrays, wherein each of said plurality of processing plates includes respective first and second major plate surfaces and wherein one of said plurality of sonic transducer arrays is positioned on at least one of said respective first and second major plate surfaces.

6. A wafer processing apparatus as set forth in claim 1 further comprising a plurality of sonic transducer arrays, wherein each of said plurality of processing plates includes respective first and second major plate surfaces and wherein one of said plurality of sonic transducer arrays is positioned on both of said respective first and second major plate surfaces.

7. A wafer processing apparatus as set forth in claim 1 further comprising a plurality of sonic transducer arrays, wherein said plurality of processing plates define a plurality of pairs of opposing major plate surfaces, and wherein one of said plurality of sonic transducer arrays is provided on at least one opposing major plate surface within at least one of said pairs of opposing major plate surfaces.

8. A wafer processing apparatus as set forth in claim 1 further comprising a plurality of sonic transducer arrays, wherein said plurality of processing plates define a plurality of pairs of opposing major plate surfaces, and wherein one of said plurality of sonic transducer arrays is provided on both of said opposing major plate surfaces within at least one of said pairs of opposing major plate surfaces.

9. A wafer processing apparatus as set forth in claim 1 further comprising an electrical charging unit coupled to said processing plate assembly, said charging unit being arranged to induce a charge on said plurality of processing plates.

10. A wafer processing apparatus as set forth in claim 1 further comprising a material emission assembly coupled to said processing plate assembly, said emission assembly defining at least one emissive point source at at least one of said processing plates.

11. A wafer processing apparatus as set forth in claim 1 further comprising a plurality of emissive port arrays, wherein each of said plurality of processing plates includes respective first and second major plate surfaces and wherein one of said plurality of emissive port arrays is positioned on at least one of said respective first and second major plate surfaces.

12. A wafer processing apparatus as set forth in claim 1 further comprising a plurality of emissive port arrays, wherein each of said plurality of processing plates includes respective first and second major plate surfaces and wherein one of said plurality of emissive port arrays is positioned on both of said respective first and second major plate surfaces.

13. A wafer processing apparatus as set forth in claim 1 further comprising a plurality of emissive port arrays, wherein said plurality of processing plates define a plurality of pairs of opposing major plate surfaces, and wherein one of said plurality of emissive port arrays is provided on at least one opposing major plate surface within at least one of said pairs of opposing major plate surfaces.

14. A wafer processing apparatus as set forth in claim 1 further comprising a plurality of emissive port arrays, wherein said plurality of processing plates define a plurality of pairs of opposing major plate surfaces, and wherein one of said plurality of emissive port arrays is provided on both of said opposing major plate surfaces within at least one of said pairs of opposing major plate surfaces.

15. A wafer processing apparatus as set forth in claim 1 further comprising a drive assembly coupled to said processing plate assembly, said drive assembly being arranged to move said plurality of processing plates.

16. A wafer processing apparatus as set forth in claim 1 wherein said processing plate assembly is further arranged to initiate a wafer processing operation.

17. A wafer processing apparatus comprising:
a processing vessel;
a wafer carrier defining a plurality of adjacent mounted wafer positions, wherein said mounted wafer positions are within said processing vessel; and
a processing plate assembly including
a plurality of processing plates defining a plurality of adjacent processing plate positions, wherein said mounted wafer positions and said processing plate positions define an interdigitated array of mounted wafer positions and processing plate positions,
a drive shaft base portion,
a drive shaft extension portion extending from said drive shaft base portion and mechanically coupled to said plurality of processing plates,
wherein said processing plate assembly is arranged to permit positioning of respective processing plates in said respective wafer gaps; and
a rotary drive assembly mechanically coupled to said drive shaft base portion, wherein
said rotary drive assembly defines a drive shaft axis of rotation substantially aligned with said drive shaft base portion, and wherein
said rotary drive assembly and said processing plate assembly collectively define a processing plate rotary path extending across an open upper vessel boundary to an external vessel location.

18. A wafer processing apparatus as set forth in claim 17 wherein said mounted wafer positions and said processing plate positions are substantially parallel.

19. A wafer processing apparatus as set forth in claim 17 wherein said processing vessel defines a vessel interior and wherein said mounted wafer positions are limited to said vessel interior.

20. A semiconductor wafer cleaning apparatus comprising:
an aqueous solution contained within a processing vessel including a vessel interior;
a wafer carrier defining a plurality of adjacent mounted wafer positions, wherein said mounted wafer positions are bounded by said aqueous solution within said processing vessel;
a processing plate assembly including
a plurality of processing plates defining a plurality of adjacent processing plate positions, wherein said mounted wafer positions and said processing plate positions define an interdigitated array of mounted wafer positions and processing plate positions, and wherein each of said plurality of processing plates includes respective first and second major plate surfaces, a drive shaft base portion, and a drive shaft extension portion extending from said drive shaft base portion and mechanically coupled to said plurality of processing plates, wherein said processing plate assembly is arranged to permit positioning of respective processing plates in said respective wafer gaps; and a rotary drive assembly mechanically coupled to said drive shaft base portion, wherein said rotary drive assembly defines a drive shaft axis of rotation substantially aligned with said drive shaft base portion, and wherein said rotary drive assembly and said processing plate assembly collectively define a processing plate rotary path extending across an open upper vessel boundary to an external vessel location; and a plurality of sonic transducer arrays, wherein said plurality of processing plates define a plurality of pairs of opposing major plate surfaces, and wherein one of said plurality of sonic transducer arrays is provided on at least one opposing major plate surface within at least one of said pairs of opposing major plate surfaces.

21. A wafer processing apparatus comprising:

an aqueous solution contained within a processing vessel including a vessel interior;

a wafer carrier defining a plurality of adjacent mounted wafer positions, wherein said plurality of mounted wafer positions are within said processing vessel;

a processing plate assembly including a plurality of processing plates defining a plurality of adjacent processing plate positions, wherein said mounted wafer positions and said processing plate positions define an interdigitated array of mounted wafer positions and processing plate positions, and wherein each of said plurality of processing plates includes respective first and second major plate surfaces, a drive shaft base portion, and a drive shaft extension portion extending from said drive shaft base portion and mechanically coupled to said plurality of processing plates, wherein said processing plate assembly is arranged to permit positioning of respective processing plates in said respective wafer gaps;

a plurality of emissive port arrays, wherein each of said plurality of processing plates includes respective first and second major plate surfaces and wherein one of said plurality of emissive port arrays is positioned on at least one of said respective first and second major plate surfaces;

a rotary drive assembly mechanically coupled to said drive shaft base portion, wherein said rotary drive assembly defines a drive shaft axis of rotation substantially aligned with said drive shaft base portion, and wherein said rotary drive assembly and said processing plate assembly collectively define a processing plate rotary path extending across an open upper vessel boundary to an external vessel location; and a material emission duct in communication with each of said emissive point sources, wherein said material emission duct is defined within said drive shaft base portion and said drive shaft extension portion.

22. A wafer processing apparatus comprising:

a processing vessel;

a wafer carrier positioned in said processing vessel and arranged to support a plurality of wafers within said processing vessel such that said wafers define respective wafer gaps between adjacent ones of said plurality of wafers, said wafer gaps being defined between opposing major wafer surfaces of respective adjacent wafers;

a processing plate assembly including a plurality of processing plates having respective major plate surfaces, a drive shaft base portion, and a drive shaft extension portion extending from said drive shaft base portion and mechanically coupled to said plurality of processing plates, wherein said processing plate assembly is arranged to permit positioning of respective processing plates in said respective wafer gaps; and a rotary drive assembly arranged to position respective processing plates in said respective wafer gaps such that respective major plate surfaces oppose respective major wafer surfaces, wherein said rotary drive assembly is mechanically coupled to said drive shaft base portion, said rotary drive assembly defines a drive shaft axis of rotation substantially aligned with said drive shaft base portion, and wherein said rotary drive assembly and said processing plate assembly collectively define a processing plate rotary path extending across an open upper vessel boundary to an external vessel location.

* * * * *